United States Patent
Kim et al.

(10) Patent No.: US 8,806,302 B2
(45) Date of Patent: Aug. 12, 2014

(54) SEMICONDUCTOR MEMORY DEVICE AND DATA PROCESSING METHOD THEREOF

(75) Inventors: Yong June Kim, Seoul (KR); Junjin Kong, Yongin-si (KR); Jaehong Kim, Seoul (KR); Hong Rak Son, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 619 days.

(21) Appl. No.: 12/654,578

(22) Filed: Dec. 23, 2009

(65) Prior Publication Data

US 2010/0202198 A1    Aug. 12, 2010

(30) Foreign Application Priority Data

Feb. 9, 2009    (KR) .................. 10-2009-0010219

(51) Int. Cl.
*G11C 29/00*    (2006.01)

(52) U.S. Cl.
USPC .............................................. 714/773

(58) Field of Classification Search
USPC .............................................. 714/773
See application file for complete search history.

(56) References Cited

U.S. PATENT DOCUMENTS

| | | |
|---|---|---|
| 7,224,296 B2 | 5/2007 | Coene |
| 2005/0166130 A1 | 7/2005 | Coene |
| 2007/0011551 A1 | 1/2007 | Coene et al. |
| 2008/0052458 A1* | 2/2008 | Micheloni et al. ............ 711/113 |
| 2008/0201538 A1 | 8/2008 | Furuichi |
| 2009/0141552 A1* | 6/2009 | Sukegawa ................ 365/185.03 |
| 2009/0292972 A1* | 11/2009 | Seol et al. ...................... 714/763 |
| 2009/0292973 A1* | 11/2009 | Seol et al. ...................... 714/763 |
| 2010/0020620 A1* | 1/2010 | Kim et al. ................ 365/185.24 |
| 2010/0125701 A1* | 5/2010 | Park .............................. 711/103 |
| 2010/0141670 A1* | 6/2010 | Cohen et al. .................. 345/589 |
| 2011/0055461 A1* | 3/2011 | Steiner et al. ................. 711/103 |
| 2011/0216586 A1* | 9/2011 | Graef et al. .............. 365/185.02 |

FOREIGN PATENT DOCUMENTS

| | | |
|---|---|---|
| JP | 09-102747 | 4/1997 |
| JP | 2000-134101 | 5/2000 |
| JP | 2005-018439 | 1/2005 |
| JP | 2005-523601 | 8/2005 |
| JP | 2008-204528 | 9/2008 |
| KR | 10-0329456 | 3/2002 |
| KR | 10-2004-0102106 | 12/2004 |
| KR | 10-2008-0071647 | 8/2008 |
| WO | WO 03/088501 | 10/2003 |

OTHER PUBLICATIONS

Akiko Kato and Kenneth Zeger, "On the Capacity of Two-Dimensional Run-Length Constrained Channels," IEEE Trans. Inform. Theory, vol. IT-45, No. 5, 99. 1527-1540, Jul. 1999.

* cited by examiner

*Primary Examiner* — Michael Maskulinski
(74) *Attorney, Agent, or Firm* — Harness, Dickey & Pierce, P.L.C.

(57) ABSTRACT

Provided is a data processing method in a semiconductor memory device. The data processing method arranges data, which is to be programmed in a row and column of a nonvolatile memory device, in a row or column direction. The data processing method encodes the programmed data into a modulation code in the row or column direction such that adjacent pairs of memory cells of the nonvolatile memory device are prevented from being programmed into first and second states.

18 Claims, 8 Drawing Sheets

| | MC1 | MC2 | MC3 | MC4 | MC5 | MC6 | MC7 | MC8 | MC9 |
|---|---|---|---|---|---|---|---|---|---|
| LSB | 1 | 0 | 0 | 1 | 1 | 0 | 0 | 1 | 0 |
| MSB | 1 | 1 | 1 | 1 | 1 | 1 | 1 | 0 | 0 |
| State | E0 | P3 | P3 | E0 | E0 | P3 | P3 | P1 | P2 |

210: MC2 MSB  
220: MC4 MSB  
230: MC6 MSB  
240: MC7 MSB (b) (d=1, k=∞)

| Input Data | Coded Data |
|---|---|
| 000 | 00000 |
| 001 | 00001 |
| 010 | 00010 |
| 011 | 00100 |
| 100 | 00101 |
| 101 | 01000 |
| 110 | 01001 |
| 111 | 01010 |

(c)

| | MC1 | MC2 | MC3 | MC4 | MC5 | MC6 | MC7 | MC8 | MC9 | MC10 | MC11 | MC12 | MC13 | MC14 | MC15 |
|---|---|---|---|---|---|---|---|---|---|---|---|---|---|---|---|
| LSB | 1 | 0 | 0 | 1 | 1 | 0 | 0 | 1 | 0 | X | X | X | X | X | X |
| MSB | 0 | 1 | 0 | 1 | 0 | 0 | 1 | 0 | 1 | 0 | 0 | 0 | 1 | 0 | 1 |
| State | P1 | P3 | P2 | E0 | P1 | P2 | P3 | P1 | P3 | X | X | X | X | X | X |

250: MC1 MSB  
260: MC9 State  
270: MC14 MSB

SEMICONDUCTOR MEMORY DEVICE AND DATA PROCESSING METHOD THEREOF

FOREIGN PRIORITY STATEMENT

This U.S. non-provisional patent application claims priority under 35 U.S.C. §119 of Korean Patent Application No. 10-2009-0010219, filed on Feb. 9, 2009, in the Korean Intellectual Property Office (KIPO), the entire contents of which are incorporated herein by reference.

BACKGROUND

The present disclosure herein relates to an electronic device, and more particularly, to a semiconductor memory device and a data processing method thereof.

Generally, a semiconductor memory is a micro electronic device that is most essential for the designs of digital logics such as applications and computers based on a microprocessor belonging to a range from a satellite to a consumer electronic technology. Therefore, the advance of the fabrication technology of a semiconductor memory including the improvement of processes and the development of technologies, obtained though scaling for high speed and a high degree of integration, is helped to establish another digital logic-based performance reference.

A semiconductor memory device is largely divided into a volatile semiconductor memory device and a nonvolatile semiconductor memory device. The nonvolatile semiconductor memory device may store data even when a power source is shut off. Data stored in a nonvolatile memory may be permanent or be reprogrammed according to a memory fabrication technology. The nonvolatile semiconductor memory device is used to store programs and micro codes in wide applications such as computers, avionics, communications and consumer electronic technology industry.

A flash memory device is included in a representative example of the nonvolatile memory device. Recently, as high integration requirements for memory devices increase, multi-bit memory devices that store multi bits in one memory cell are generalized. In the memory cells of the multi-bit flash memory device, intervals between threshold voltage distributions should be densely controlled. That is, data retention characteristic is most important in association with the reliability of data. However, the threshold voltages of memory cells may be changed due to various factors. Electric charges (or electrons) stored in floating gates may be leaked through various failure mechanisms such as thermion emission, electronic charge spreading, ion impurities and programming disturbance stress due to the defect of a dielectric layer. This may cause the shift of threshold voltages. In a state where the control gates of memory cells are kept at a certain voltage (for example, a power source voltage or a read voltage), when the floating gates gradually obtain electric charges, electric charges can be obtained due to read disturbance. This causes the increase of the threshold voltages. Due to the various factors, the threshold voltages of memory cells may increase or decrease for each state. In a Charge Trapping Flash (CTF) memory device, particularly, issues such as lateral charge spreading become important. In a multi-bit memory device for storing a more number of data in one memory cell, technologies for solving these limitations are necessarily required.

SUMMARY

The present disclosure provides a flash memory device and a data management method thereof, which can decrease the probability of error occurrence.

Example embodiments provide a data processing method in a semiconductor memory device including: arranging data, which is to be programmed in a row and column of a nonvolatile memory device, in a row or column direction; and encoding the programmed data into a modulation code in the row or column direction such that adjacent pairs of memory cells of the nonvolatile memory are prevented from being programmed into first and second states, respectively, the first and second states being chosen based on threshold voltages of the first and second states.

In other example embodiments, a method for preparing data to be programmed into a nonvolatile semiconductor memory device having a plurality of memory cells arranged in columns and rows, each of the plurality of memory cells having one of a plurality of threshold voltage states corresponding to the data stored in the memory cell, each of the plurality of threshold voltage states having different levels, includes encoding the data which is to be programmed into a modulation code in at least one of the row or column direction such that for each adjacent pair of memory cells from among the plurality of memory cells, the adjacent pair of memory cells is prevented from being programmed to have a threshold voltage difference greater than a reference value, the threshold voltage difference being a difference between the levels of the threshold voltages corresponding to each of the pair of adjacent memory cells.

In other example embodiments, a semiconductor memory device includes: a nonvolatile memory including a plurality of memory cells which are arranged in a row and a column; and a memory controller configured to control the nonvolatile memory, wherein the memory controller in configured to arrange data, which is to be programmed in a row and column of the nonvolatile memory, in a row or column direction, the memory controller is configured to encode the data which is to be programmed into a run length limited code in the row or column direction such that adjacent pairs of memory cells from among the plurality of memory cells are prevented from being programmed into first and second states, respectively, the first and second states being chosen based on threshold voltages of the first and second states, and the memory controller is configured to program the encoded data.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIG. 5 is Tables incrementally showing the examples of run length limited coding;

DETAILED DESCRIPTION OF THE EMBODIMENTS

Figure 1:
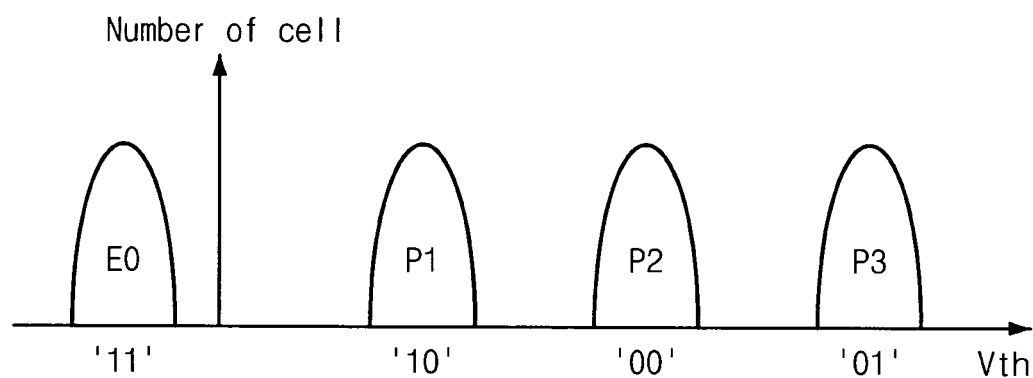
FIG. 1 is a diagram illustrating the threshold voltage distribution of a multi-bit flash memory device.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Below, a flash memory device is used as one example of a nonvolatile memory for illustrating characteristics and functions of example embodiments. However, those skilled in the art can easily understand other advantages and performances of example embodiments according to the descriptions. For example, Phase-change Random Access Memory (PRAM), Magnetoresistive Random Access Memory (MRAM), Resistance Random Access Memory (ReRAM), Ferroelectric Random Access Memory (FRAM) and NOR flash memory may be used as storage medium. Furthermore, a 2-bit Multi Level Cell (MLC) is exemplified as an example for describing the features of example embodiments. However, example embodiments may be easily applied to a multi bit memory device that programs data of three bits or more in one memory cell.

Moreover, example embodiments may be implemented or applied through other embodiments. Besides, the detailed description may be amended or modified according to viewpoints and applications, not being out of the scope, technical idea and other objects of example embodiments.

Hereinafter, in the detailed description of example embodiments, the technical features of example embodiments will be described by using a Run-Length Limited Code (RLLC) as an example of a Modulation Code (MC). However, this example of the MC is not only limited to the RLLC.

FIG. 1 is a diagram exemplarily illustrating the threshold voltage distribution of a multi-bit flash memory device.

Referring to FIG. 1, the threshold voltage of a memory cell is illustrated in which 2 bits are stored in one memory cell.

An erasure state E0 corresponding to data '11' has the lowest threshold voltage level. 2-bit data and programming states may be arranged in programming state P1 corresponding to data '10', a programming state P2 corresponding to data '00' and a programming state P3 corresponding to data '01', respectively. Herein, the correspondence relationships of 2-bit data corresponding to each of the programming states E0, P1, P2 and P3 are merely examples. The programming states E0, P1, P2 and P3 and 2-bit data corresponding to the states may be variously changed according to the design scheme of a memory device.

In a flash memory device, when adjacent memory cells have different threshold voltages, the memory cells affect one another. For example, like lateral charge spreading, the threshold voltage of a memory cell may increase or decrease according to the threshold voltage of an adjacent memory cell. Particularly, lateral charge spreading is remarkable between a memory cell that is programmed into the erasure state E0 among the memory cells and a memory cell that is programmed into the programming state P3 having the highest threshold voltage.

As described above, the shift of the threshold voltage occurs by various factors such as programming disturbance and coupling, in addition to lateral charge spreading.

Figure 2:
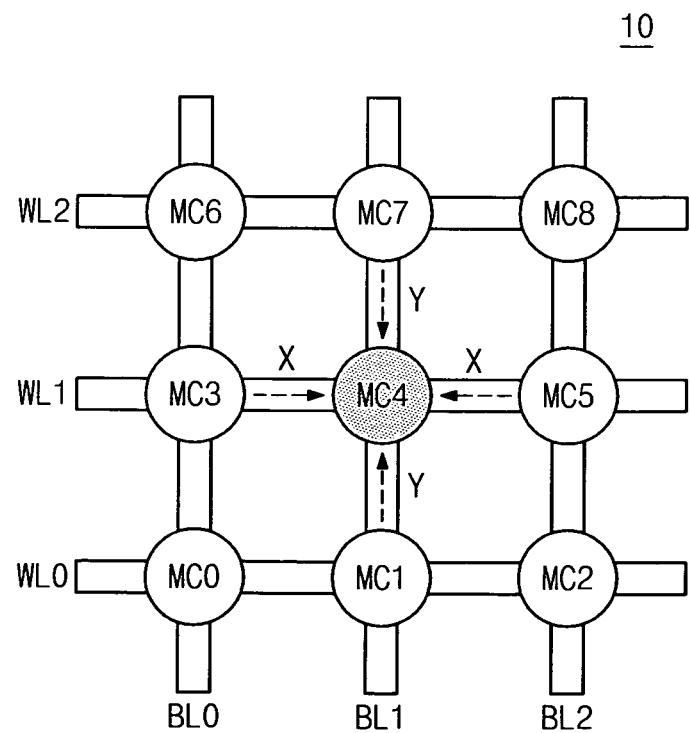
FIG. 2 is a diagram illustrating lateral charge spreading which occurs in a multidimensional direction.

FIG. 2 is a diagram schematically illustrating a portion of a cell array 10 of a flash memory device.

Referring to FIG. 2, in a programming operation, a memory cell is physically affected by memory cells that are adjacent to or peripheral to it. Because of memory cells MC1, MC3, MC5 and MC7 that are disposed at the periphery and physically affects the memory cell, the threshold voltage of a memory cell MC4 is varied although the memory cell MC4 is not directly programmed. Hereinafter, a plurality of affected cells (for example, the memory cells MC1, MC3, MC5 and MC7) are referred to as aggress cell, and an affected cell (for example, the memory cell MC4) is referred to as a victim cell.

A representative case of shifting the threshold voltage of a memory cell is lateral charge spreading. Moreover, the threshold voltage of a victim cell MC4 is shifted from an original programmed threshold voltage to a certain threshold voltage level by a coupling effect. Coupling or lateral charge spreading is exemplified as the shift example of the threshold voltage of the victim cell MC4. In addition to these cases, however, the threshold voltages of the memory cells are shifted by various factors. For example, the threshold voltages of the memory cells are shifted (for example, lowered) due to the deterioration of an oxide layer that is caused by the elapse of time, the increase of a Hot Temperature Stress (HTS) and the increase of a programming/erasing (P/E) cycle. Alternatively, the threshold voltage of the victim cell MC4 may increase by programming disturbance that is caused by the programming of peripheral cells. Furthermore, because of a physical influence that the aggress cells give to the victim cell, the threshold voltage of a victim cell MC0 may be shifted due to the charge loss of the aggress cells MC1, MC3, MC5 and MC7. In a CTF memory, particularly, dispersion may be deteriorated by lateral charge spreading in which electric charges are moved to peripheral cells in device characteristic, like a charge trapping layer. Lateral charge spreading may occur in the word line direction, and also it may occur in the bit line direction. For solving these limitations, accordingly, a solution means for the word line direction is required, and moreover, a solution means for the bit line direction is required.

The threshold voltages of the memory cells are shifted due to the above-described factors. Accordingly, in the reading operation of a nonvolatile memory device, a read margin decreases because of the shift of the threshold voltage that has been described above, thereby overlapping the dispersions of two adjacent threshold voltages. In this case, the errors of a plurality of bits may be included in read data. However, a coding method according to example embodiments can solve limitations that may be caused by the shift of a threshold voltage.

Figure 3:
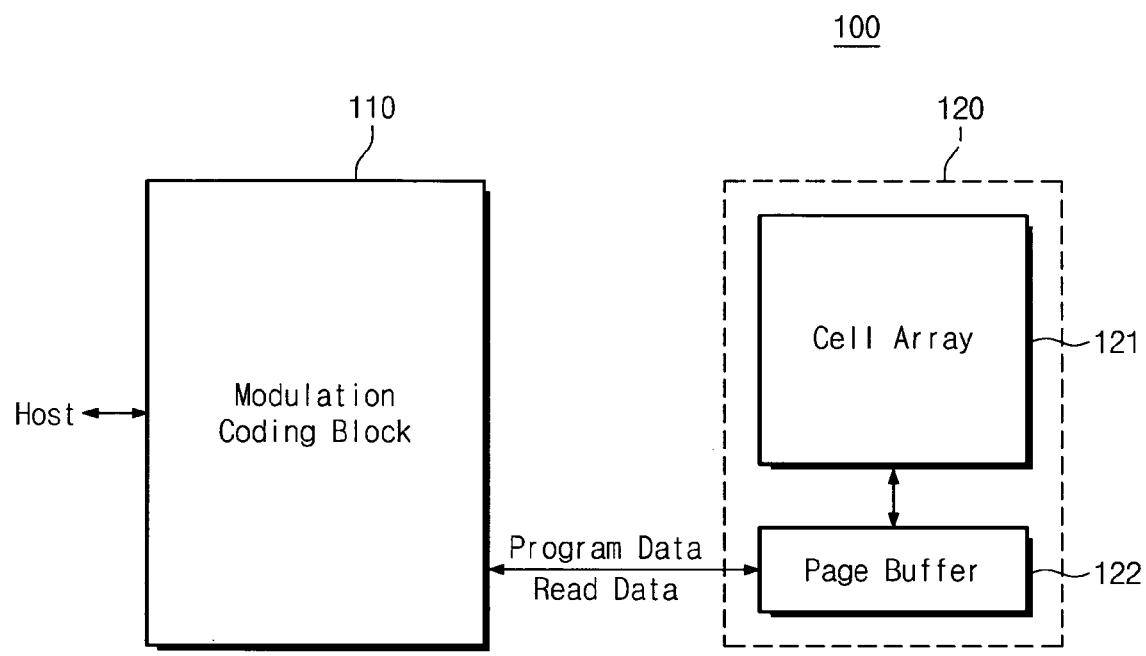
FIG. 3 is a block diagram illustrating a memory system according to example embodiments.

FIG. 3 is a block diagram illustrating a memory system 100 according to example embodiments. A memory system 100 according to example embodiments includes a nonvolatile memory device 120 and a modulation coding block 110 that encodes data to be stored in the nonvolatile memory device 120 in a modulation coding scheme.

The modulation coding block 110 encodes programming data provided from a host in the modulation coding scheme and provides the encoded data to the nonvolatile memory device 120. The modulation coding block 110 decodes read data that are read from the nonvolatile memory device 120 and provides the decoded data to the host. The modulation coding block 110 may be included in a memory controller that interfaces the nonvolatile memory device 120 and the host. The memory controller controls the nonvolatile memory device 120 to read stored data from the nonvolatile memory device 120 or to program data in response to the read/programming request of the host. The modulation coding block 110 may be included in the memory controller in a hardware type of configuration or a software type such as firmware. However, the position of the modulation coding block 110 is not limited to the above-described embodiments.

The nonvolatile memory device 120 programs programming data provided from the modulation coding block 110 in the nonvolatile memory cells of a cell array 121. Programming data encoded by the modulation coding block 110 is temporarily loaded in the page buffer 122 of the nonvolatile memory device 120. The programming data loaded in the page buffer 122 are programmed in the cell array 121. When a read command is provided from the host, the nonvolatile memory device 120 senses data stored in the location of the cell array 121 to store the sensed data in the page buffer 122. Read data that are stored in the page buffer 122 are transferred to the modulation coding block 110. The modulation coding block 110 decodes read data and transfers the decoded data to the host.

The modulation coding block 110 encodes programming data provided from the host by applying multidimensional modulation coding. That is, X-Run Length Limited (X-RLL) coding, in consideration of lateral charge spreading that occurs in the word line direction of the cell array 121, is applied. Furthermore, lateral charge spreading that occurs in the bit line direction (i.e., Y-direction) independently of the word line direction and Y-Run Length Limited (Y-RLL) coding for preparing charge transfer are applied. Run length limited coding operations applied in each direction are independent. In a programming operation, the modulation coding block 110 provides programming data to which run length limited coding is applied, to the nonvolatile memory device 120. In a reading operation, the modulation coding block 110 applies decoding that decodes a run length limited code from read data provided by the nonvolatile memory device 120. The decoded read data may be transferred to the host.

Figure 4:
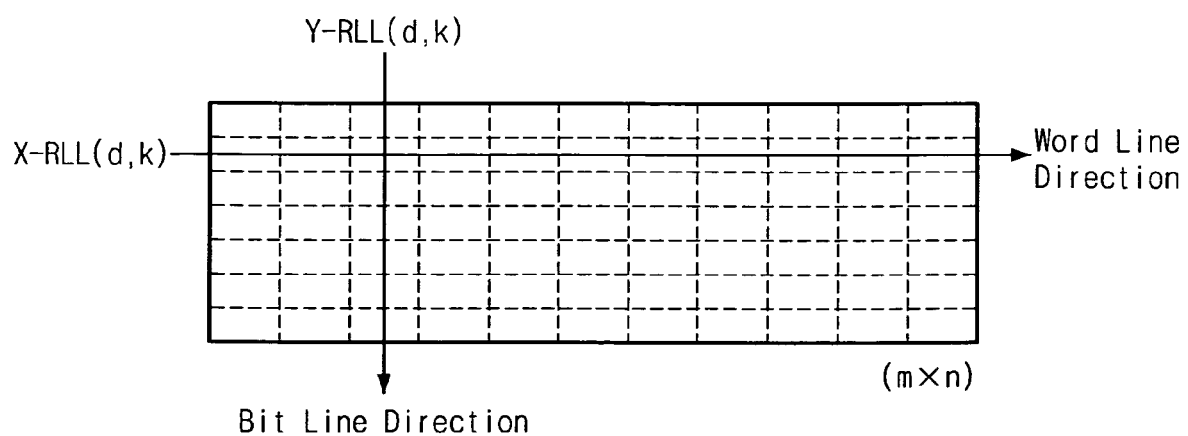
FIG. 4 is a diagram exemplarily illustrating multidimensional run length limited coding.

FIG. 4 is a diagram exemplarily illustrating multidimensional run length limited coding as an example of a modulation code.

Referring to FIG. 4, programming data provided from the host forms the row of the word line direction and the column of the bit line direction. That is, input programming data may form an m×n matrix. However, when including a multi level cell in which the data of a plurality of bits are stored in one memory cell, input programming data may form the m×n matrix corresponding to each page. In FIG. 4, an m×n matrix for one page data or the memory cells is illustrated. However, in the case of a 2-bit multi level cell, programming data may separately form a Least Significant Bit (LSB) page matrix and a Most Significant Bit (MSB) page matrix. For example, in a cell array including a 3-bit multi level cell, a matrix corresponding to each of three pages may be formed.

The modulation coding block 110 (see FIG. 3) performs run length limited coding for each of a row and a column on programming data that are composed of an m×n matrix. Herein, n defining the size of the column is determined on the basis of the code rate of run length limited coding. That is, based on the number of bits that are increased by run length limited coding, the size n of the column is determined as a value less than one page or one sector. Likewise, m defining the size of the row is also determined on the basis of the code rate of run length limited coding. That is, based on the number of bits that are increased in the column direction by run length limited coding, the size m of the row in a data matrix is determined.

That is, if an m×n matrix is data to be programmed in one memory block, m and n are enough less than the number of the memory cells of the row and column of a memory block. Therefore, programming data corresponding to the number of bits that are increased according to run length limited coding may be applied in the row direction and the column direction. However, although the m×n matrix has an enough margin to a memory block, bits that are increased according to run length limited coding with another available memory block may be applied.

When the formation of an m×n matrix is completed, the modulation coding block 110 may perform two-dimensional run length limited coding in the row direction and the column direction on a total m×n data matrix. Herein, row-direction and column-direction two-dimensional run length limited coding that is performed after the formation of the m×n matrix has been described above, but it is not limited thereto. That is, although the m×n matrix is not formed and only one row is inputted, the modulation coding block 110 may perform row-direction run length limited (X-RLL) coding on one input row. Subsequently, an algorithm may be configured to perform row-direction and column-direction run length limited coding on the basis of the data value of a pre-inputted row. That is, data of at least two word lines that are continued are accumulated for performing column-direction run length limited (Y-RLL) coding.

With reference to FIG. 4, two-dimensional run length limited coding for each of the row direction and the column direction has been described above. However, the above-described two-dimensional run length limited coding may be performed on each of a plurality of page matrixes, and run length limited coding may be applied only to any one page matrix on the basis of a code rate. For example, by applying run length limited coding on an MSB page matrix in the nonvolatile memory device having the programming state and data correspondence relationships of FIG. 1, the objects of example embodiments can be achieved. This example will be described below in detail with reference to FIG. 5.

FIG. 5 is Tables incrementally showing the examples of run length limited coding.

Referring to FIG. 5, the example of run length limited coding will be described below on data (for example, any one of m rows) corresponding to one word line or data (for example, any one of n columns) corresponding to one bit line. By this coding, a case in which the threshold voltages of adjacent memory cells in the word line direction and the bit line direction have an erasure state E0 and a programming state P3 can be avoided. Herein, although the memory cells are distributed in the row direction for convenience, the same algorithm is also applied in the column direction.

A Table 'a' is one that schematically shows programming data before run length limited coding. The Table 'a' lists a portion of two page (LSB, MSB) data to be programmed in any one word line including 2-bit multi level cells.

Memory cells in which the erasure state E0 and the most significant programming state P3 are adjacent are configured with memory cell pairs MC1-MC2, MC3-MC4 and MC5-MC6, respectively. That is, as the LSB and MSB of logic 1, data to be programmed in the memory cell MC1 correspond to the erasure state E0. As the LSB of logic 0 and the MSB of logic 1, data to be programmed in the memory cell MC2 correspond to the programming state P3. Accordingly, the memory cells MC1 and MC2 correspond to a programming state condition 'E0-P3' 210 requiring run length limited coding.

Data to be programmed in the memory cell MC3 are the LSB of logic 0 and the MSB of logic 1, and correspond to the programming state P3. Data to be programmed in the memory cell MC4 are the LSB of logic 1 and the MSB of logic 1, and correspond to the erasure state E0. Accordingly, the memory cells MC3 and MC4 correspond to the programming state condition 'P3-E0' 220 requiring run length limited coding.

Data to be programmed in the memory cell MC5 are the LSB of logic 1 and the MSB of logic 1, and correspond to the erasure state E0. Data to be programmed in the memory cell MC6 are the LSB of logic 0 and the MSB of logic 1, and correspond to the programming state P3. Accordingly, the memory cells MC5 and MC6 correspond to the programming state condition 'E0-P3' 230 requiring run length limited coding. On the other hand, memory cells MC7 to MC9 does not include a programming condition in which an erasure state is adjacent to the programming state P3 corresponding to a most significant threshold voltage.

In the Table 'a', a condition in which the erasure state E0 is adjacent to the programming state P3 can be seen. That is, all the MSBs of data corresponding to the programming state P3 and the erasure state E0 are logic 1. Accordingly, a data state in which the erasure state E0 is adjacent to the programming state P3 occurs in a case where memory cells having the MSB of logic 1 are adjacent to each other. That is, the adjacent condition between the erasure state E0 and the programming state P3 occurs in a case where the MSBs of data that is programmed in adjacent memory cells have logic 1 continuously. This MSB condition is represented as reference numeral 240.

For avoiding the adjacent condition between the erasure state E0 and the programming state P3, row-direction run length limited (X-RLL) coding, which performs coding so that the MSBs of adjacent programmed memory cells may not continuously have logic 1, is required. Although memory cells that are arranged in the row direction have been described above with reference to the Table 'a', they may also be identically applied to a bit line direction, i.e., the row direction.

A Table 'b' schematically shows a code (d, k) as an example of a binary run length limited code configured so that logics 1 cannot be adjacent. Herein, 'd' means the minimum number of logic 0 that is allowed between two logics 1, and 'k' means the maximum number of logic 0 that is allowed between two logics 1. The Table 'b' shows an example in which a run length limited code of 3-bit input 5-bit output is configured in a lookup table type, based on a condition (d=1, k=∞). When some data of an MSB page to be programmed in memory cells that are sequentially adjacent on the same word line are '010', the modulation coding block 110 (see FIG. 3) outputs data '00010' by applying run length limited coding. When the 3-bit data of an MSB page to be programmed are '111', the modulation coding block 110 outputs data '01010' by applying run length limited coding. A run length limited code is not limited only to the lookup table type of the Table 'b'.

A Table 'c' shows a result that is obtained by applying a (d=1, k=∞)-based run length limited code in the Table 'b' to the MSB pages of the memory cells in the Table 'a'. An LSB page is the same as a value before the application of run length limited coding. In an MSB page, however, data of 3-bit length increase to 5-bit length through run length limited coding and thereby row-direction memory cells are sequentially shifted. That is, before run length limited coding is performed, MSB data to be programmed in the memory cells MC1 to MC3 was '111'. However, data '111' of the MSB page are encoded into '01010' 250 through run length limited coding. For programming 5-bit data, accordingly, the memory cells MC1 to MC5 are used. Before run length limited coding is performed, moreover, MSB data to be programmed in the memory cells MC4 to MC6 was '111'. However, data '111' of the MSB page are encoded into '01010' 260 through run length limited coding. For programming 5-bit data, accordingly, the memory cells MC6 to MC10 are used. Before run length limited coding is performed, MSB data to be programmed in the memory cells MC7 to MC9 was '100'. However, data '100' of the MSB page are encoded into '00101' 270 through run length limited coding. For programming 5-bit data, accordingly, the memory cells MC11 to MC15 are used.

Like the result of the Table 'c', by applying run length limited coding to the MSB page, a case in which the erasure state E0 and the programming state P3 are adjacent between adjacent memory cells can be prevented. Herein, only a run length limited code for the MSB page has been applied, but it is not limited thereto. That is, a run length limited code for the LSB page may be applied. The LSBs and states of memory cells MC11 to MC15 are represented as 'X', or 'don't care' because run length limited coding is not applied to the LSB data values of the memory cells MC1 to MC9 rendering specific LSB values for MC10-MC15 unnecessary. The state is varied according to the values of the MSB data to which run length limited coding is applied.

In the above description, only a run length limited coding for the MSB page has been applied, but it is not limited thereto. Although a code rate decreases, a run length limited code may be simultaneously applied to the LSB page and the MSB page. Although run length limited coding that is performed in the row direction has been described above with reference to the Tables 'a', 'b' and 'c', it is simultaneously applied to the column direction.

Figure 6:
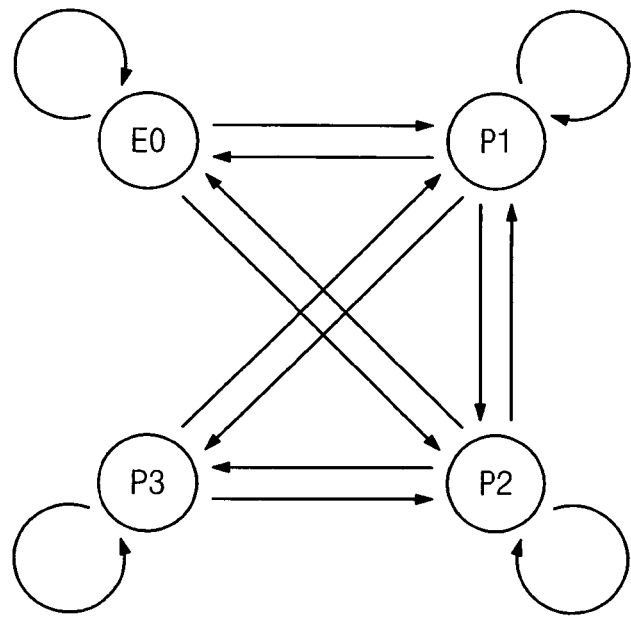
FIG. 6 is a state diagram for applying M-ary run length limited coding.

FIG. 6 is a state diagram illustrating an example of M-ary run length limited coding.

Referring to FIG. 6, in a case where data is processed in word line units, the aspect of the state shift of adjacent memory cells is configured as illustrated.

States, in which a memory cell adjacent to a memory cell that is programmed in an erasure state E0 are programmable, include an erasure state E0, a programming state P1 and a programming state P2. States, in which a memory cell adjacent to a memory cell that is programmed in a programming state P1 are programmable, include an erasure state E0, a programming state P1, a programming state P2 and a programming state P3. States, in which a memory cell adjacent to a memory cell that is programmed in a programming state P2 are programmable, include an erasure state E0, a programming state P1, a programming state P2 and a programming state P3. States, in which a memory cell adjacent to a memory cell that is programmed in a programming state P3 are programmable, include an erasure state E0, a programming state P1, a programming state P2 and a programming state P3. That is, the state diagram of FIG. 6 shows that memory cells adjacent to a memory cell programmed in the erasure state E0 may be programmed in states other than the programming state P3. The state diagram of FIG. 6 shows that memory cells adjacent to a memory cell programmed in the programming state P3 may be programmed in states other than the programming state E0.

Figure 7:
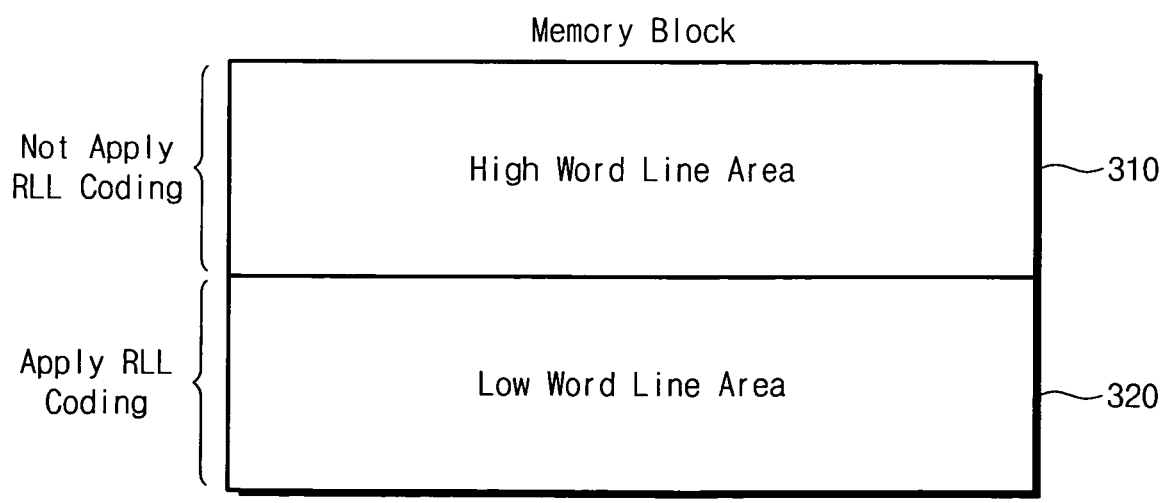
FIG. 7 is a block diagram illustrating a method of applying selective run length limited coding.

FIG. 7 is a block diagram illustrating another example for increasing a code rate in a case of using the above-described multidimensional run length limited coding.

Referring to FIG. 7, in a nonvolatile memory such as a flash memory device, it has been known that the influence of programming disturbance is different. Accordingly, a technology that selectively applies run length limited coding according to the location of programmed memory cells will be described below with reference to FIG. 7.

The influence of programming disturbance remarkably appears in a low word line area 320 that is first programmed. Accordingly, the modulation coding block 110 (see FIG. 2) detects whether a location in which programming data is programmed corresponds to the low word line area 320 and thereby determines whether run length limited coding is performed. In a case where a row address that is inputted together with programming data corresponds to a high word line area 310, the modulation coding block 110 does not apply run length limited coding.

By applying this selective run length limited coding, the overhead of a system based on additional algorithm can be reduced.

Figure 8A:
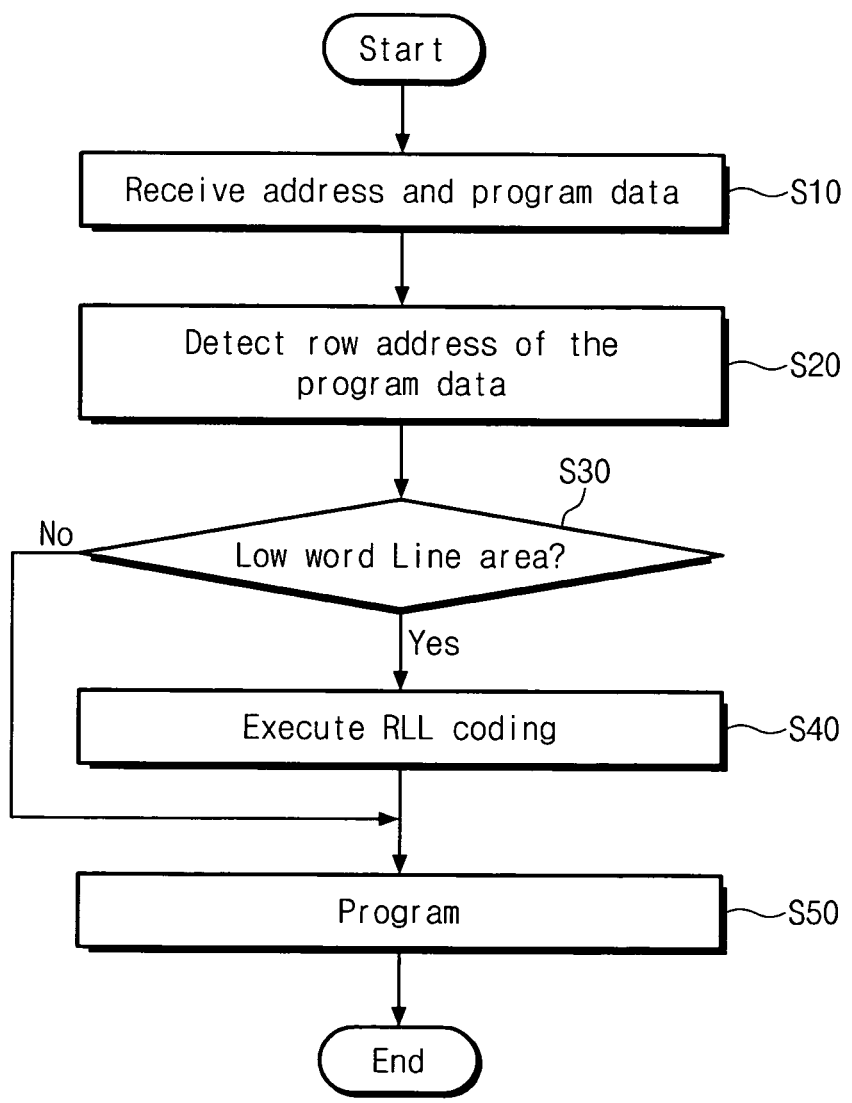
FIG. 8A is a flow chart illustrating a method for programming data in a nonvolatile memory.
Figure 8B:
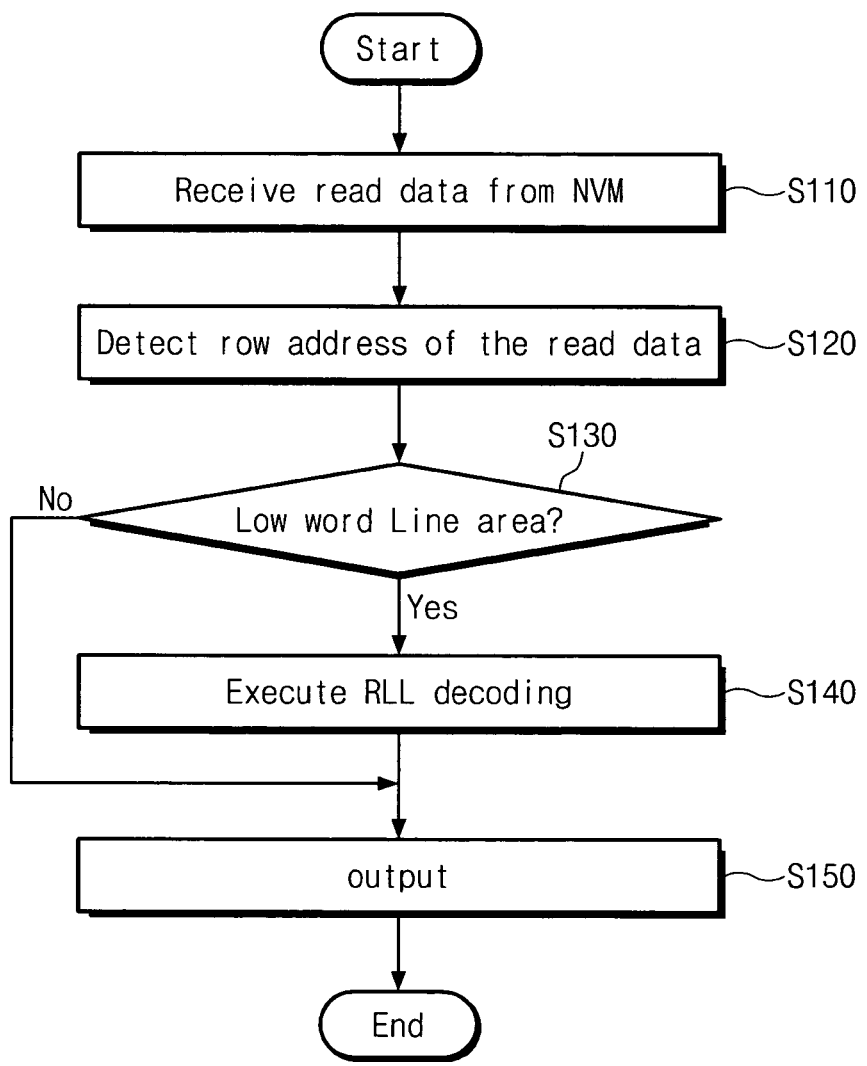
FIG. 8B is a flow chart illustrating a method for reading data from the nonvolatile memory.

FIGS. 8A and 8B are flow charts illustrating selective run length limited coding which has been described above with reference to FIG. 7. FIG. 8A is a flow chart illustrating a method for programming data in a nonvolatile memory. FIG. 8B is a flow chart illustrating a method for reading data from the nonvolatile memory.

Referring to FIG. 8A, based on a row address that is inputted by a memory controller (not shown) together with programming data, a semiconductor memory device according to example embodiments determines whether to perform run length limited coding. When programming data and an address are inputted from the host together with a programming command, the memory controller processes data for the programming of programming data. For example, the memory controller may perform an address mapping operation that converts a logical address provided from the host into the physical address of the nonvolatile memory device. Alternatively, the memory controller may insert a parity bit into programming data through error correction coding in operation S10.

Subsequently, detection for a memory block in which programming data determined through address mapping and the row address of the memory block is performed. The semiconductor memory device detects whether the row address corresponds to a low word line area or a high word line area in the memory block in operation S20. The semiconductor memory device determines whether to perform run length limited coding according to a case in which the row address corresponds to the low word line area or not in operation S30.

When the row address corresponds to the low word line area, the semiconductor memory device proceeds to an operation of applying run length limited coding on programming data inputted. That is, the memory controller controls the modulation coding block 110 (see FIG. 3) in order to perform run length limited coding in operation S40. On the other hand, when the row address is not included in the low word line area, i.e., when the row address corresponds to the high word line area, run length limited coding is omitted.

Based on the row address, the semiconductor memory device performs programming for programming data to which run length limited coding is applied or data to which run length limited coding is not applied and which are provided from the host in operation S50. When the programming of the programming data is completed, a programming operation applying selective run length limited coding is ended.

FIG. 8B schematically illustrates a method for reading data that are programmed according to operations in FIG. 8A. First, the memory controller receives data from the nonvolatile memory device in response to an access command (for example, a read command) to the nonvolatile memory in operation S110. Subsequently, the memory controller detects the row address of read data provided in operation S120.

The semiconductor memory device detects whether a row address corresponds to the low word line area or the high word line area on the memory block of read data in operation S130. When the row address of read data is included in the low word line area, for example a row address in the lower half of row addresses or a row address corresponding to data having a low programming priority, the semiconductor memory device proceeds to operation S140 of performing run length limited decoding. When run length limited decoding is completed, read data are outputted to the outside or the host in operation S150. On the other hand, when the row address of read data does not correspond to the low word line area, for example a row address in the upper half of row addresses or a row address corresponding to data having a high programming priority, run length limited decoding is omitted. Furthermore, data that are read from the nonvolatile memory are directly outputted in operation S150.

The above-described flow charts in FIGS. 8A and 8B illustrate embodiments for selectively performing run length limited coding. Because programming disturbance remarkably occurs in the low word line area, by applying run length limited coding only to an abnormal area, the total code rate of run length limited coding can increase.

Figure 9:
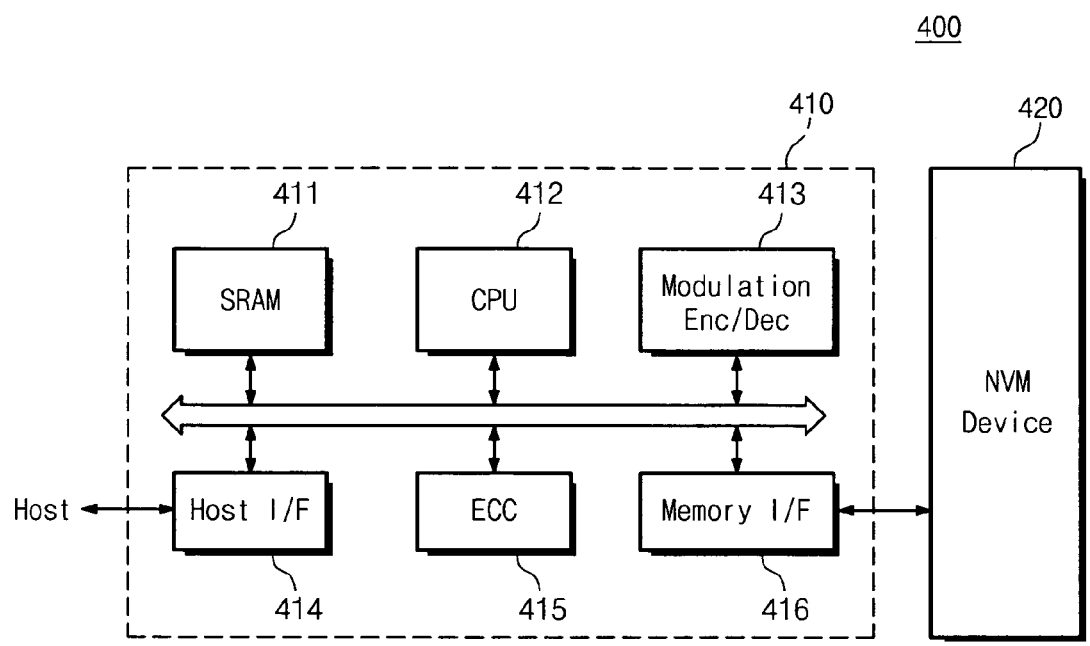
FIG. 9 is a block diagram illustrating a flash system which stores or reads data in a data processing method according to example embodiments.

FIG. 9 is a block diagram schematically illustrating a memory system 400 according to example embodiments.

Referring to FIG. 9, a memory system 400 according to example embodiments includes a nonvolatile memory device 420 and a memory controller 410.

The nonvolatile memory device 420 may be configured with the flash memory device that includes the cell array 121 and the page buffer 122 in FIG. 3. The memory controller 410 may be configured to control the nonvolatile memory device 420. The memory controller 410 may be implemented with a memory card or a Solid State Disk (SSD) by coupling the nonvolatile memory device 420 and the memory controller 410. A Static Random Access Memory (SRAM) 411 is used as the operation memory of a Central Processing Unit 412. A modulation encoder/decoder 413 processes programming data so that the erasure state E0 and the programming state P3 may not be adjacent, for the row direction and the column direction. Moreover, by decoding read data, modulation decoded data are recovered into original data. The modulation encoder/decoder 413 performs the substantially same function as that of the modulation coding block 110 in FIG. 3. The modulation encoder/decoder 413 may be configured in hardware, but may be configured in software such as firmware.

A host interface 414 includes the data exchange protocol of the host connecting to the memory system 400. An Error Correcting Code (ECC) block 415 detects and corrects an error included in data that are read from the nonvolatile memory device 420. A memory interface 416 interfaces the nonvolatile memory device 420. The CPU 412 performs an overall control operation for the data exchange of the memory controller 410. Although not shown, the memory system 400 may further include a ROM (not shown) that stores code data for interfacing the host. This is apparent to one those skilled in the art. The nonvolatile memory device 420 may be implemented with a multi-chip package including a plurality of flash memory chips. The memory system 400 may be implemented with high-reliability storage medium in which the probability of error occurrence is low. Particularly, a memory system, like an SSD that is being actively researched, may include the flash memory device according to example embodiments. In this case, the memory controller 410 may be configured to communicate with the outside (for example, the host) though any one of various interface protocols such as USB, MMC, PCI-E, SATA, PATA, SCSI, ESDI and IDE.

Herein, the memory controller 410 accesses the nonvolatile memory device 420 in a scheme that has been described above based on example embodiments. That is, the modulation encoder/decoder 413 may be configured to selectively perform run length limited coding on a row address.

Figure 10:
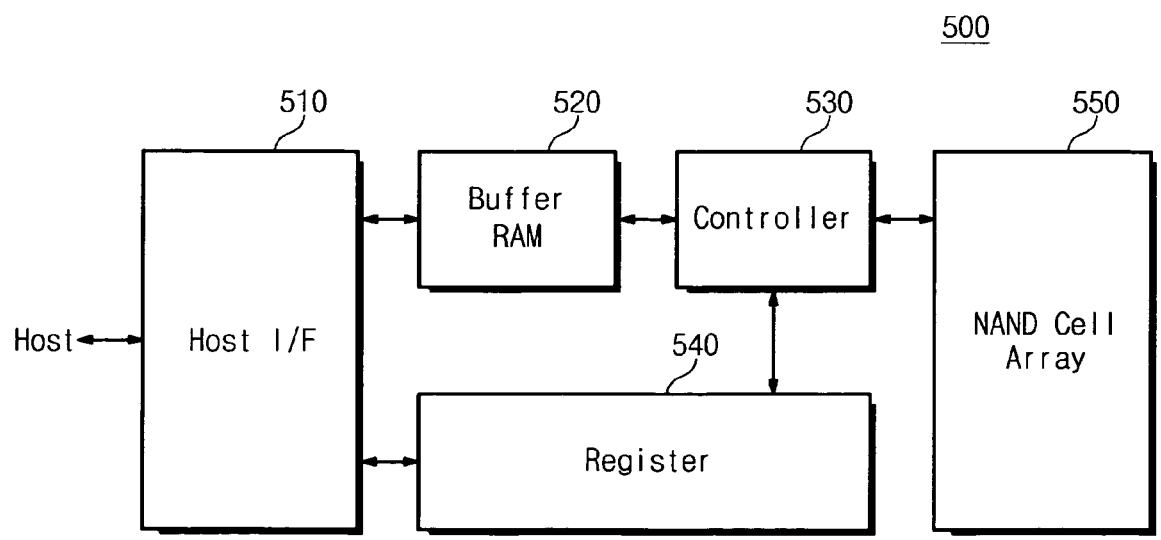
FIG. 10 is a block diagram illustrating a OneNAND flash memory device which stores or reads data in a data processing method according to example embodiments.

FIG. 10 is a block diagram schematically illustrating a fusion memory device or a fusion memory system 500 for performing a programming operation according to example embodiments. For example, the technical features of example embodiments may be applied to a OneNAND flash memory device 500, as a fusion memory device.

A OneNAND flash memory device 500 includes a host interface 510, a buffer Random Access Memory (RAM) 520, a controller 530, a register 540, and a NAND flash cell array 550. The host interface 510 exchanges all sorts of information with a device which uses different protocol. The buffer RAM 520 includes a built-in code for driving a memory device or temporarily stores data. The controller 530 controls reading, programming and all states in response to a control signal and a command that are provided from the outside. The register 540 stores commands, addresses, and data such as configuration that defines a system operation environment in the memory device 500. The NAND flash cell array 550 includes a nonvolatile memory cell and a page buffer. The OneNAND flash memory device 500 may program data in the NAND flash cell array 550 through programming operations according to example embodiments for preventing the physical influence of aggress cells, in response to a programming request from the host. Alternatively, a separate memory controller for controlling the OneNAND flash memory device 500 may perform run length limited coding.

Figure 11:
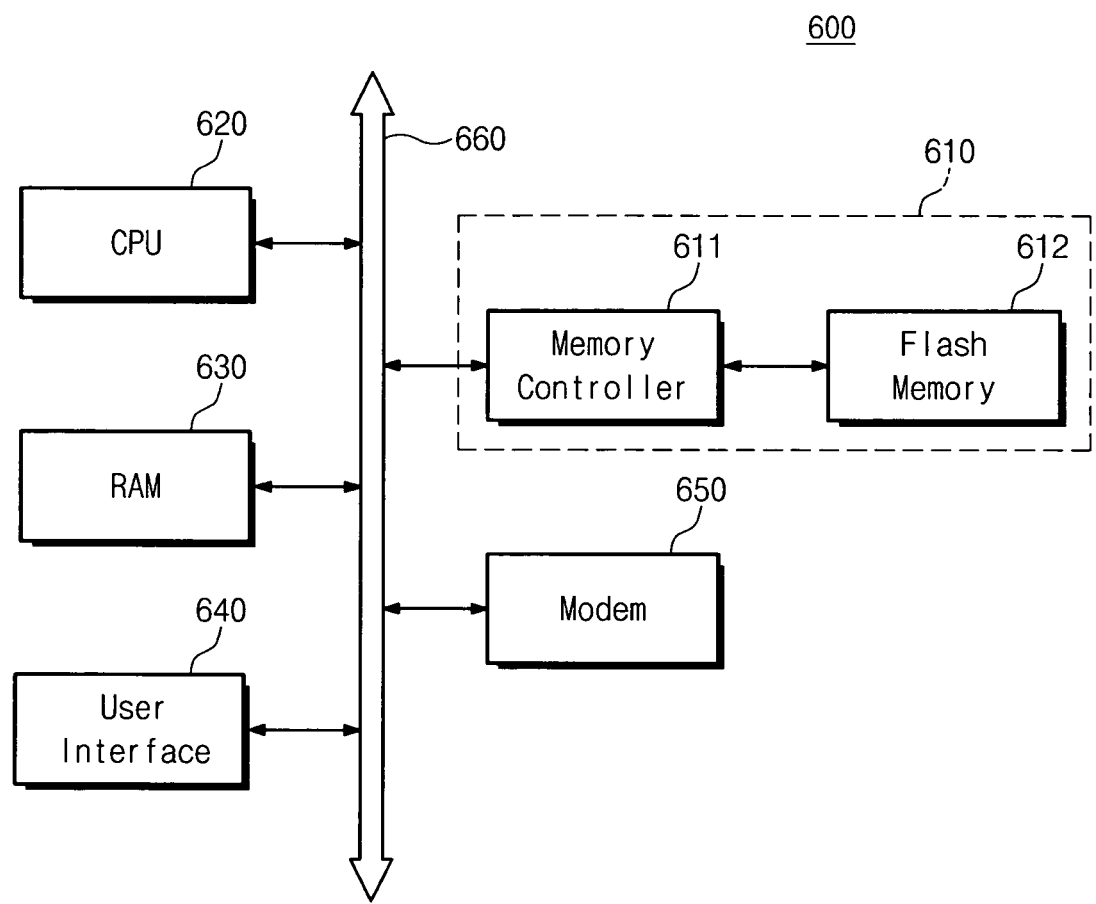
FIG. 11 is a block diagram illustrating a computing system including a memory card which operates in a data processing method according to example embodiments.

FIG. 11 schematically illustrates a computing system 600 including a flash memory device 612 according to example embodiments.

Referring to FIG. 11, a computing system 600 according to example embodiments includes a microprocessor 620 electrically connected to a system bus 660, a RAM 630, a user interface 640, a modem 650 such as a baseband chipset, and a memory system 610. The memory system 610 may be configured with the substantially same elements as those of FIG. 9 or FIG. 10. When the computing system 600 is a mobile device, the computing system 600 may further include a battery (not shown) for supplying its own operation voltage. Although not shown, the computing system 600 may further include an application chipset, a Camera Image Processor (CIP) and a mobile DRAM. This is apparent to one those skilled in the art. The memory system 610, for example, may configure a solid state drive/disk that uses a nonvolatile memory in storing data. Alternatively, the memory system 610 may be implemented with a fusion flash memory (for example, a OneNAND flash memory).

The flash memory device and/or the memory controller according to example embodiments may be mounted with various types of packages. For example, the flash memory device and/or the memory controller according to example embodiments may be mounted with packages such as Package on Package (PoP), Ball Grid Arrays (BGAs), Chip Scale Packages (CSPs), Plastic Leaded Chip Carrier (PLCC), Plastic Dual In-Line Package (PDIP), Die In Waffle Pack (DIWP), Die In Wafer Form (DIWF), Chip On Board (COB), Ceramic Dual In-Line Package (CERDIP), Plastic Metric Quad Flat Pack (MQFP), Thin Quad Flat Pack (TQFP), Small Outline Package (SOP), Shrink Small Outline Package (SSOP), Thin Small Outline Package (TSOP), Thin Quad Flat Pack (TQFP), System In Package (SIP), Multi Chip Package (MCP), Wafer Level Stack Package (WLSP), Die In Wafer Form (DIWF), Die On Waffle Package (DOWP), Wafer-level Fabricated Package (WFP) and Wafer-Level Processed Stack Package (WSP).

According to example embodiments, the programming states of the memory cells can be programmed to avoid arrangement capable of causing an error. Accordingly, reliability for data stored in the memory device can increase.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A data processing method in a semiconductor memory device including a plurality of memory cells, the data processing method comprising:
arranging first data, which is to be programmed in a row and column of a nonvolatile memory device, in a row or column direction;
encoding the first data to be programmed into a modulation code in the row or column direction; and
programming the encoded data into pairs of adjacent memory cells from among the plurality of memory cells, the plurality of memory cells each storing a same number of bits, the encoded data being encoded such that,
for each of the pairs of adjacent memory cells of the plurality of memory cells into which the encoded data is being programmed, the memory cells in the pair of adjacent memory cells are prevented from being programmed into first and second states, respectively, even if the first data is data that, if programmed into the plurality of memory cells before the encoding, would result in a pair of adjacent memory cells from among the plurality of memory cells being programmed into the first and second states, respectively.

2. The data processing method of claim 1, wherein:
the first state is an erasure state, and
the second state is a most significant programming state corresponding to a highest threshold voltage among a plurality of programming states.

3. The data processing method of claim 1, wherein:
the memory cells of the nonvolatile memory are multi level cells, and
the data to be programmed is configured as a plurality of matrices corresponding to a plurality of pages which are programmed in the cells of the nonvolatile memory device.

4. The data processing method of claim 3, wherein encoding the data to be programmed includes encoding a row and column of a matrix from among the plurality of matrices which corresponds to a Most Significant Bit (MSB) page into a modulation code.

5. The data processing method of claim 3, wherein the plurality of matrices are arranged as two-dimensional matrices each having a row direction corresponding to a word line direction and a column direction corresponding to a bit line direction.

6. The data processing method of claim 1, further comprising:
dividing data to be programmed into at least two sub-matrices according to a programming order,
wherein the at least two sub-matrices include a first sub-matrix corresponding to a plurality of word lines having high programming priority and a second sub-matrix corresponding to a plurality of word lines having lower programming priority than the programming priority of the word lines of the first sub-matrix, in a programming operation.

7. The data processing method of claim 6, wherein encoding the data to be programmed into the modulation code includes encoding the first sub-matrix of the at least two sub-matrices into the modulation code.

8. The data processing method of claim 6, wherein dividing the data to be programmed into the at least two sub-matrices is performed on the basis of a row address corresponding to the programmed data.

9. The method of claim 1,
wherein the memory cells of the nonvolatile memory are multi-level cells arranged in rows and columns in the nonvolatile memory,
the arranging the data to be programmed includes arranging the data into a first matrix including a plurality of first values arranged in a plurality rows and a plurality of columns such that, for each of the plurality of first values, the first value represents the data to be programmed into a memory cell, from among the plurality of memory cells, having a row and column corresponding to the row and column of the first value in the first matrix,
the encoding the data to be programmed into a modulation code includes generating a second matrix including a plurality of second values, the plurality of second values being values resulting from applying a run length limited code to the first values of the first matrix in at least one of a row direction and a column direction of the first matrix,
and the programming the modulated code includes programming the second values into the nonvolatile memory.

10. A method for preparing data to be programmed into a nonvolatile semiconductor memory device having a plurality of memory cells arranged in columns and rows, each of the plurality of memory cells having one of a plurality of threshold voltage states corresponding to the data stored in the memory cell, each of the plurality of threshold voltage states having different levels, the method comprising:
encoding the data which is to be programmed into a modulation code in at least one of the row or column direction; and
programming the encoded data into pairs of adjacent memory cells from among the plurality of memory cells, the plurality of memory cells each storing a same number of bits, the encoded data being encoded such that,
for each of the pairs adjacent of memory cells from among the plurality of memory cells into which the encoded data is being programmed, the memory cells in the adjacent pair of memory cells are prevented from being programmed to have a threshold voltage difference greater than a reference value, even if the first data is data that, if programmed into the plurality of memory cells before the encoding, would result in a pair of adjacent memory cells from among the plurality of memory cells being programmed such that the threshold voltage difference that is not greater than the reference value, the threshold voltage difference being a difference between the levels of the threshold voltages corresponding to the memory cells in the adjacent pair of memory cells, respectively.

11. The method of claim 10 wherein the reference value is equal to a difference between a level of a maximum threshold voltage state from among the plurality of threshold voltage states and a level of a minimum threshold voltage state from among the plurality of threshold voltage states.

12. The data processing method of claim 10, wherein:
the plurality of memory cells are multi level cells, and
the data to be programmed is configured as a plurality of matrices corresponding to a plurality of pages to be programmed in the plurality of cells.

13. The data processing method of claim 12, wherein encoding the data to be programmed includes encoding a row and column of a matrix from among the plurality of matrices which corresponds to a Most Significant Bit (MSB) page into a modulation code.

14. The data processing method of claim 12, wherein the plurality of matrices are arranged as two-dimensional matrices each having a row direction corresponding to a word line direction and a column direction corresponding to a bit line direction.

15. The data processing method of claim 10, further comprising:
dividing data to be programmed into at least two sub-matrices according to a programming order,
wherein the at least two sub-matrices include a first sub-matrix corresponding to a plurality of word lines having high programming priority and a second sub-matrix corresponding to a plurality of word lines having lower programming priority than the programming priority of the word lines of the first sub-matrix, in a programming operation.

16. The data processing method of claim 15, wherein encoding the data to be programmed into the modulation code includes encoding the first sub-matrix of the at least two sub-matrices into the modulation code.

17. The data processing method of claim 15, wherein dividing the data to be programmed into the at least two sub-matrices is performed on the basis of a row address corresponding to the programmed data.

18. A semiconductor memory device, comprising:
a nonvolatile memory including a plurality of memory cells which are arranged in a row and a column; and
a memory controller configured to control the nonvolatile memory,
wherein the memory controller is configured to arrange data which is to be programmed in a row and column of the nonvolatile memory in a row or column direction, the memory controller is configured to encode the data which is to be programmed into a run length limited code in the row or column direction, and the memory controller is configured to program the encoded data into adjacent pairs of memory cells of the nonvolatile memory, the encoded data being encoded such that adjacent pairs of memory cells from among the plurality of memory cells are prevented from being programmed into first and second states.

* * * * *